United States Patent
Wang et al.

(10) Patent No.: US 6,867,543 B2
(45) Date of Patent: Mar. 15, 2005

(54) MICRODEVICE ASSEMBLY HAVING A FINE GRAIN GETTER LAYER FOR MAINTAINING VACUUM

(75) Inventors: Joe P. Wang, Long Grove, IL (US); Cheryl B. Field, Kildeer, IL (US); Michael Pfeifer, Northbrook, IL (US)

(73) Assignee: Motorola, Inc., Schaumburg, IL (US)

( * ) Notice: Subject to any disclaimer, the term of this patent is extended or adjusted under 35 U.S.C. 154(b) by 84 days.

(21) Appl. No.: 10/403,637

(22) Filed: Mar. 31, 2003

(65) Prior Publication Data
US 2004/0189198 A1 Sep. 30, 2004

(51) Int. Cl.[7] .............................. H01J 19/70; H01J 9/38
(52) U.S. Cl. ....................... 313/553; 313/481; 313/549; 313/561
(58) Field of Search ................................. 313/553, 481, 313/549, 561; 417/48

(56) References Cited

U.S. PATENT DOCUMENTS

| | | |
|---|---|---|
| 4,771,214 A | 9/1988 | Takenaka et al. |
| 5,610,431 A | 3/1997 | Martin |
| 5,614,785 A | 3/1997 | Wallace et al. |
| 5,650,568 A | 7/1997 | Greiff et al. |
| 5,837,562 A | 11/1998 | Cho |
| 5,866,978 A * | 2/1999 | Jones et al. .................. 313/495 |
| 6,016,034 A | 1/2000 | Corazza et al. |
| 6,194,830 B1 * | 2/2001 | Cho et al. .................... 313/553 |
| 6,225,145 B1 | 5/2001 | Choi et al. |
| 6,277,666 B1 | 8/2001 | Hays et al. |
| 6,323,550 B1 | 11/2001 | Martin et al. |
| 6,338,284 B1 | 1/2002 | Najafi et al. |

FOREIGN PATENT DOCUMENTS

| | | |
|---|---|---|
| EP | 0 720 260 A1 | 7/1997 |
| EP | 0 851 492 A2 | 7/1998 |
| EP | 0 720 260 B1 | 2/2001 |

OTHER PUBLICATIONS

Anderson, R. et al. "Investigation of Porous Silicon Vapor Sensing" *Sensors and Actuators*; A21–A23– 1990, pp, 835–839.

Dresser, M.J. et al. "The Absorption and Decomposition of $NH_3$ on Si(100) Detection of the $NH_2(a)$ Species." *Surface Science*; 1989, pp. 75–89.

Dillon, A.C. et al. "Diethylsilane Decomposition on Silicon Surfaces Studied Using Transmission FTIR Spectroscopy." *J.Electrochemical Society*; vol. 139, No. 2, Feb. 1992, pp. 537–541.

Robinson, M.B. et al. "Porous Silicon Photoluminescence Versus HF Etching: No Correlation with Surface Hydrogen Species." *American Institute of Physics*; Mar. 1993, pp, 1493–1495.

(List continued on next page.)

*Primary Examiner*—Ashok Patel
(74) *Attorney, Agent, or Firm*—Thomas V. Miller; Brian M. Mancini

(57) ABSTRACT

A microdevice assembly (20) that includes a device microstructure (22), a housing (30), and a fine grain getter layer (40). The housing (30) has a base portion (32) and a lid (34). The device microstructure (22) is attached to the base portion (32) and the lid (34) is hermetically sealed to the base portion (32). The housing (30) defines a cavity (38) surrounding the device microstructure (22). The fine grain getter layer (40) is on an interior side (42) of the lid (34) for maintaining a vacuum in the cavity (38) surrounding the device microstructure (22). The lid (34) may be made of metal or have at least a metallic surface in the region where the fine grain getter layer (40) is applied. The fine grain getter layer (40) has a sub-micron grain size. There is also a method for making the microdevice assembly (20).

14 Claims, 3 Drawing Sheets

OTHER PUBLICATIONS

Collins, R.T. et al. "Photoinduced Hydrogen Loss From Porous Silicon." *American Institute of Physics*; Oct. 1992, pp, 1649–11651.

Takahagi, T. et al. "Control of the Chemical Reactivity of a Silicon Single–Crystal Surface Using the Chemical Modification Technique." *American Institute of Physics*; Sep. 1990, pp, 2187–2191.

Cheng, C.C. et al. "Direct Determination of Absolute Monoslayer Coverages of Chemisorbed $C_2H_2$ and $C_2H_4$ on Si(100)." *American Institute of Physics*; Apr. 1992, pp. 3693–3699.

Smith, R.L. et al. "Thick Films of Silicon Nitiride." *Sensors and Actuators*; A21–A23, 1990, pp. 830–834.

Petersen, K. "Silicon as a Mechanical Material." *Proceedings of the IEEE*; vol. 70, No. 5, May 1982, pp. 420–456.

Kozlowski, F. et al. "Generating a Microplasma with Porous Silicon." *Transducers*; 1995, 90–PB4.

Smith, R.L. et al. "Porous Silicon Morphologies and Formation Mechanism." *Sensors and Actuators*; A21–A23, 1990, pp. 825–829.

Smith, R.L. et al. "Porous Silicon Formation Mechanisms." *American Institute of Physics*; Apr. 1992, pp. R1–R22.

Giorgi, T.A., "An Updated Review of Getters and Gettering." *Journal of Vacuum Science Technology*; A3 (2) Mar./Apr. 1995. pp. 417–423.

Henkel, S. "Novel Gas Sensor Exploits a Property of Porous Silicon." www.sensormag.com, May 2002.

Higashi, G.S. et al. "Comparison of Si(111) Surfaces Prepared Using Aqueous Solutions of $NH_4F$ Versus HF." *American Institute of Physics*; Apr. 1991, pp. 1656–1658.

Hirashita, N. et al. "Effects of Surface Hydrogen on the Air Oxidation at Room Temperature of HF–treated Si(100) Surfaces." *American Institute of Physics*; Jan. 1990 pp. 451–453.

Higashi, G.S. et al. "Ideal Hydrogen Termination of Si(111) Surface." *American Institute of Physics*; Feb. 1990, pp. 656–658.

Gupta, P. "FTIR Studies of $H_2O$ and $D_2O$ decomposition on Porous Silicon Surfaces." *Surface Science* ; 1991, pp. 360–372.

O'Halloran, G.M. et al. "A Bulk Micromachined Humidity Sensor Based on Porous Silicon." *Transducers* 1997, pp 563–566.

Richter, A. "Design Considerations and Performance of Adsorptive Humidity Sensors with Capacitive Readout." *Transducers*; 1993, pp. 310–313.

\* cited by examiner

MICRODEVICE ASSEMBLY HAVING A FINE GRAIN GETTER LAYER FOR MAINTAINING VACUUM

FIELD OF THE INVENTION

This invention in general relates to microdevice assemblies having an internal structure that requires a vacuum cavity and, more particularly, to a microdevice assembly having a fine grain getter layer for maintaining the vacuum in the cavity surrounding the internal structure.

BACKGROUND OF THE INVENTION

The microdevices manufactured by micro electro mechanical system (MEMS) technology are playing key roles in many areas. For instance, micromechanical gyroscopes have enabled several important control systems in transportation and commercial applications. Other microdevices such as pressure sensors, accelerometers, actuators and resonators fabricated by MEMS technology are also used in many areas.

Some microdevices, such as micro gyroscopes and resonators contain a microstructure that needs to be maintained within a vacuum-sealed cavity. For these types of devices, there is a continuing need to improve the longevity of the vacuum. A vacuum-sealed cavity is typically susceptible to pressure increases due to gas generation during the hermetic sealing process and outgassing from the package material, sealing material, and components within the cavity. This pressure variation can degrade device performance and reduce device lifetime for many hermetically sealed microdevices.

In various applications, it has been known to use certain types of getters to adsorb vapor and gas species. In particular, it has been known to use high sorption getters that are made of porous sintered metallic particles. The use of these types of getters has been met with varying degrees of success. For instance, with the porous metallic getters there is a serious reliability issue caused by getter particles falling down during fabrication process or after the device experiences vibration or shock. It has been found that particles that shed from these getters can jam a sensor element in a microdevice, especially microdevices that have sensor elements that have very fine features on the order of 2 microns. Jamming will cause intermittent or permanent damage to the sensor element.

In other applications, it has been known to use a permeable container that prevents getter particles from contaminating other components such as European Patent Specification, EP 0 720 260 B1, entitled "Getter Housing for Optoelectronic Packages." This design, however, would add more process steps and increase manufacturing cycle time and cost if applied to microdevice sensor applications.

A non-evaporable getter material is described in U.S. Pat. No. 6,016,034. However, that process needs a separate carrier for the getter material before incorporation into microdevice sensor applications. Again, this design would add more process steps and increase manufacturing cycle time and cost. Moreover, the average grain size of the particles generated form this getter is 10–20 microns or even larger. Any released particles may cause problems if applied to applications using a sensor element with fine features.

For non-metallic getters, these may be formed from organic salts of silicon such as that described in an electron tube application in U.S. Pat. No. 4,771,214. Another non-metallic getter formed from deposited amorphous silicon or poly-silicon for flat panel display applications is described in U.S. Pat. No. 5,614,785. With relation to non-metallic getters, the mechanical properties of known amorphous or poly-crystalline silicon will change with deposition condition and are difficult to repeat. Known types of non-metallic getters are typically used in large sized cavities with large planar areas. Other types of getters are directed to adsorbing moisture within a cavity that is not perfectly hermetic.

The following co-pending patent application describes devices and methods that overcome several of the problems with the application of existing getters in microdevice assemblies: "Hermetically Sealed Microdevices Having a Single Crystalline Silicon Getter for Maintaining Vacuum," by Xiaoyi Ding, Ser. No. 10/260,675, which is owned by the assignee of the present invention and hereby incorporated by reference herein in its entirety. Although the devices and methods described in that application are helpful, further devices and methods are needed.

It is, therefore, desirable to provide further improved microdevice assemblies having a structure resided in a hermetically sealed cavity to overcome most, if not all, of the preceding problems.

Figure 1:
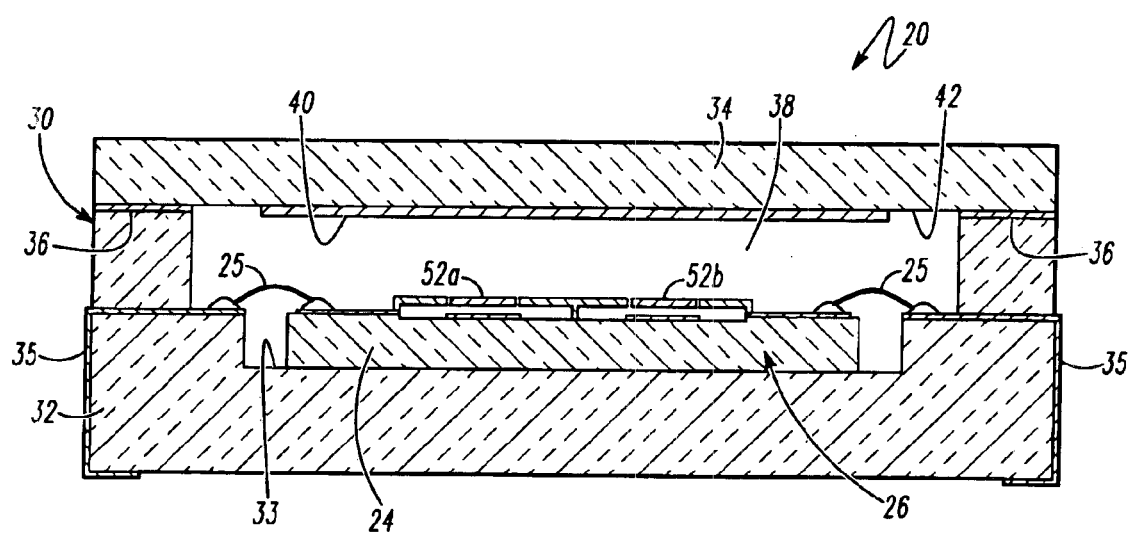
FIG. 1 is a cross-sectional view of one embodiment of the present invention of a microdevice assembly having a getter sealed at the package level.

While the invention is susceptible to various modifications and alternative forms, specific embodiments have been shown by way of example in the drawings and will be described in detail herein. However, it should be understood that the invention is not intended to be limited to the particular forms disclosed. Rather, the invention is to cover all modifications, equivalents and alternatives falling within the spirit and scope of the invention as defined by the appended claims.

DETAILED DESCRIPTION

What is described is a microdevice assembly having an internal structure that requires a vacuum cavity and, more particularly, to a microdevice assembly having a fine grain getter layer for maintaining the vacuum in the cavity surrounding the internal structure. In one embodiment, the fine grain getter layer may be formed by a thin film deposition method, such as sputtering, that is applied directly to a lid of the microdevice assembly. After appropriate activation, the fine grain getter layer is suitable for adsorbing vapors and many gas species. The fine grain getter layer may contain materials such as Zirconium (Zr) to increase the silicon getter reactivity to certain species.

To this end, in one embodiment there is a microdevice assembly that comprises a device microstructure, a housing, and a fine grain getter layer. The housing has a base portion and a lid. The device microstructure is attached to the base portion. The lid is hermetically sealed to the base portion. The housing defines a cavity surrounding the device microstructure. The fine grain getter layer is deposited on an interior side of the lid for maintaining a vacuum in the cavity surrounding the device microstructure. The lid of the housing is preferably made of a material that has at least an outer surface that is metallic. For instance the lid of the housing may be made out of a KOVAR material and electroplated with a metallic material. Alternatively, the lid could be made of other types of materials such as alloy42 or steels.

The microdevice assembly is particularly suitable for device microstructures that sense angular rate and that include a pair of movable proof masses that oscillate within the cavity. The fine grain getter layer should have a sub-micron grain size. The fine grain getter layer is in a spaced apart relationship from the device microstructure and can be activated by a thermal or other process to adsorb vapor and gas species.

There is also a microdevice assembly comprising a hermetically sealed housing, a microdevice die, and at least one fine grain getter layer. The hermetically sealed housing has an internal surface and an internal cavity. The microdevice die has a substrate and a microstructure formed thereon. The microdevice die is mounted within the internal cavity of the hermetically sealed housing. The fine grain getter layer is deposited on the internal surface and within the internal cavity of the housing and is used to maintain a vacuum surrounding the microdevice die. Again, the portion of the housing where the fine grain getter layer is attached is preferably made of a material that has at least an outer surface that is metallic. For instance, the lid of the housing may be made out of a KOVAR material and electroplated with a metallic material. Alternatively, the lid could be made of other types of materials such as alloy42 or steels.

Another embodiment is a method for making a microdevice assembly that comprises the steps of: providing a base portion of a housing, the base portion having a recess; attaching a microdevice die to the recess of the base portion of the housing; providing a lid of the housing; applying a fine grain getter layer to the lid of the housing; subjecting the base portion of the housing and the lid of the housing to a vacuum environment; activating the fine grain getter layer such that the getter layer is capable of adsorbing vapor and gas species; and attaching the lid of the housing to the base portion of the housing to form a hermetically sealed cavity adjacent the microdevice die. The step of applying a fine grain getter layer to the lid may include sputtering an extremely thin layer of a Zirconium (Zr) based alloy to the lid. The step of applying a fine grain getter layer to the lid may further include sputtering a thin layer such that it has a sub-micron grain size.

Turning to the drawings, FIG. 1 shows a cross-sectional view of one embodiment of a microdevice assembly 20 hermetically sealed at the package level. The microdevice assembly 20 may include a microdevice die 26, a hermetically sealed housing 30, and at least one fine grain getter layer 40. The microdevice die 26 may be part of a sensing element having a microstructure 22 attached to a substrate 24. Here, the microdevice die 26 can provide sensing capabilities. For example, a micro gyroscope senses angular rate. For purposes of illustration, the description and figures are shown in the context of an angular rate sensor.

One type of microstructure 22 for an angular rate sensor contains two movable proof masses 52a, 52b. In general, the proof masses 52a, 52b are vibrated in the same plane (in-plane) at a predetermined frequency by a motor. The motor may include electrodes that drive the proof masses 52a, 52b in the same plane in an oscillatory manner. The oscillation of the proof masses 52a, 52b is controlled to a frequency near the resonant frequency of the proof masses 52a, 52b.

Figure 2:
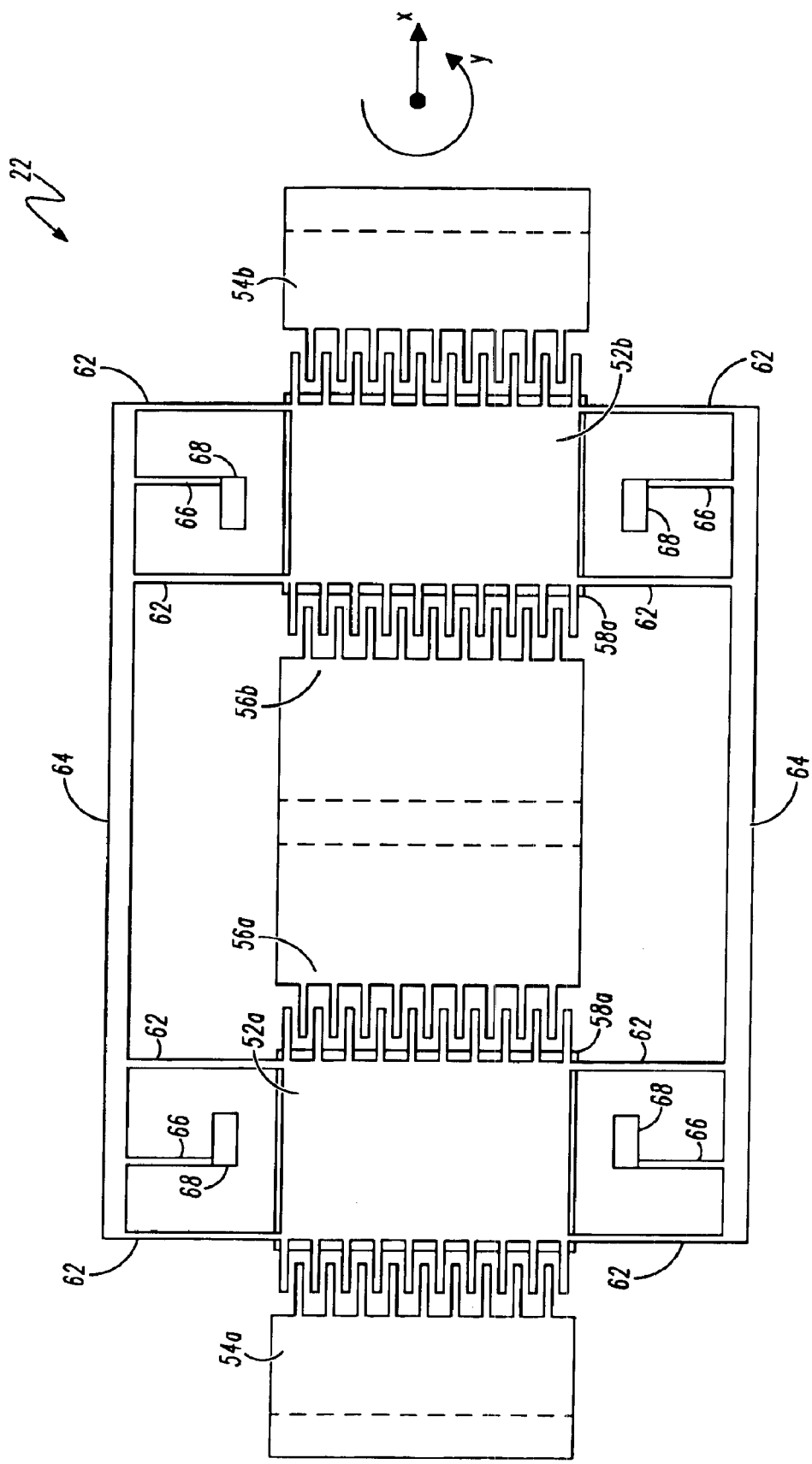
FIG. 2 is a top view of a structure for the microdevice assembly.

FIG. 2 illustrates a top view of one embodiment of the microstructure 22 for a microdevice assembly 20. Here, the microstructure 22 includes a pair of movable proof masses 52a, 52b, a pair of outer combs 54a, 54a, a pair of inner combs 56a, 56b, and a pair of out-of-plane sensing electrodes 58a, 58b. The components of the microstructure 22 are mounted to the substrate 24 and housed within the hermetically sealed housing 30.

The pair of proof masses 52a, 52b are attached to a series of drive beams 62, base beams 64, and torsion beams 66. The beams 62, 64, 66 permit the proof masses 52a, 52b to move in relation to a series of anchor points 68. The anchor points are rigidly attached to the substrate 22. The proof masses 52a, 52b are permitted to move in at least two planes. The first plane (in-plane) is defined by an x-axis as shown in FIG. 2. The second plane (out-of-plane) is defined by a y-axis.

Figure 3:
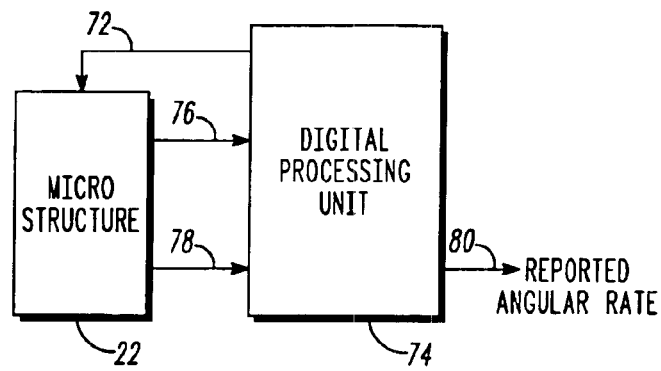
FIG. 3 is a block diagram for operating the structure for the microdevice assembly.

The pair of outer combs 54a, 54b are electrodes that drive the proof masses 52a, 52b in the first plane defined by the x-axis. The pair of outer combs 52a, 52b may be mounted to the substrate 22. Referring to FIG. 3, the outer combs 52a, 52b are driven by an externally induced motor drive signal 72 generated by a digital processing 74 or, alternatively, through a separate analog system. The drive signal 72 is generated in a closed loop manner to oscillate the proof masses 52a, 52b at a frequency near the resonance frequency of the proof masses 52a, 52b.

The pair of inner combs 56a, 56b are in the same plane as the proof masses 52a, 52b. The pair of inner combs 56a, 56b may be mounted to the substrate 24. The pair of inner combs 56a, 56b may be electrodes that sense the movement of the proof masses 52a, 52b in the x-axis. The pair of inner combs 56a, 56b are used to report a first signal 76 to the digital processing unit 74 as shown in FIG. 3.

The pair of out-of-plane sensing electrodes 58a, 58b sense the out-of-plane movement of the proof masses 52a, 52b. The pair of out-of-plane sensing electrodes 58a, 58b may be positioned beneath the pair of proof masses 52a, 52b. The pair of out-of-plane sensing electrodes 58a, 58b are used to report a second signal 78 to the digital processing unit 74 as shown in FIG. 3. The second signal 78 will contain an angular rate component that reflects the angular rate externally induced to the microstructure 22. The second signal 78 is representative of the movement of the proof masses 52a, 52b in the y-axis caused by an externally induced rotational rate. Although not critical to the present invention, it is noted that the digital processing unit 74 receives the signals 76 and 78 and extracts an angular rate component to report an angular rate 80.

What is critical, however, is that the microstructure 22 be surrounded by a cavity 38 that is under a vacuum. To maintain a vacuum, traditional getter materials have been found to be inadequate for sensor structures such as those found in FIG. 2. The reason is that particles from traditional getters can release and settle on and around the oscillatory moving proof masses 52a, 52b. This will cause intermittent or permanent damage to the sensing capabilities of the microdevice.

In one embodiment of the present invention, referring back to FIG. 1, the housing 30 includes a base portion 32 and a lid 34. The base portion 32 and the lid 34 are hermetically sealed together by a sealing material 36. The material for the housing 30 should include at least a portion having an outer metallic surface. The outer metallic surface is used for attaching the fine grain getter layer 40. For instance, a suitable material for the lid 34 is KOVAR and electroplated with a metallic material such as nickel and/or gold. Alternatively, the lid 34 may be made of other types of materials such as alloy42 or steels. In any event, the housing 30 defines the internal cavity 38. As described below, the fine grain getter layer 40 is formed within the internal cavity 38 for maintaining a vacuum within the internal cavity 38. Wire bonds 25 may be used to connect the microdevice die 26 with metal traces 35 on the housing 30.

In one embodiment, the fine grain getter layer 40 is formed on the lid 34 of the housing 30 so that the getter layer 40 is in a spaced apart relationship with the die 26. The getter layer 40 is made from an extremely fine grain and densely populated getter material. In a preferred embodiment, the getter layer 40 is about 3–5 $\mu$m thick and is deposited on an internal side 42 of the lid 34. The grain size for the getter layer 40 should be less than 1 micron (sub-micron). This type of fine grain getter layer 40 may be obtained from SAES Getters USA Inc., Colorado Springs, Colo. and contain metallic materials such as a Zirconium (Zr) based alloy. The deposition of the fine grain getter layer 40 is preferably done by a physical vapor deposition technique, such as sputtering.

Figure 4:
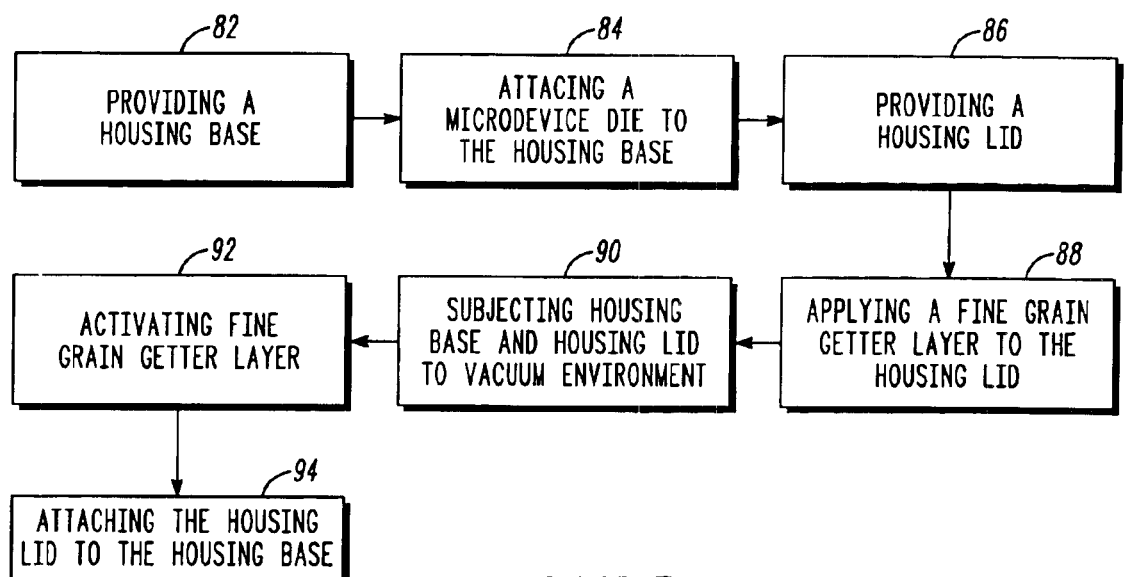
FIG. 4 is a flow diagram of assembling the microdevice assembly of the present invention.

FIG. 4 is a flow diagram illustrating one embodiment for assembling the microdevice assembly 20. In block 82, the process includes providing a base portion 32 of a housing 30. The design of the base portion 32 may be similar to that shown in FIG. 1 and made of a rigid material such as KOVAR. In particular, the base portion 32 may have a recess 33.

In block 84, the process includes attaching a microdevice die 26 to the base portion 32 of the housing 30. In one embodiment, the microdevice die 26 is attached within the recess 33 of the base portion 32. As described above, the microdevice die 26 may comprise a microstructure 22 and a substrate 24. The substrate 24 portion of the microdevice die 26 may be physically attached to the base portion 32 of the housing 30 by a bonding process that uses either gold or a soldering material. The microdevice die 26 may be electrically connected to the base portion 32 of the housing 30 by wire bonds 25 as shown in FIG. 1.

In block 86, the process also includes providing a lid 34 of a housing 30. The design of the lid 34 may be similar to that shown in FIG. I and made of a rigid material such as KOVAR. Moreover, in one embodiment, the lid 34 may be selectively or fully electroplated with a metallic material such as nickel and/or gold. This should be done at least in the area of the lid 34 that the getter layer 40 is to be applied.

In block 88, the process further includes applying a fine grain getter layer to a side 42 on the lid 43. The getter layer 40 needs to be made from an extremely fine grain and densely populated getter material (sub-micron grain). Moreover, the getter layer 40 needs to be extremely thin (about 3–5 $\mu$m thick) and can be deposited on the side 42 of the lid 34 through a physical vapor deposition technique. In one embodiment, the fine grain getter layer 40 is a Zirconium (Zr) based alloy obtained from SAES Getters USA Inc., Colorado Springs, Colo.

In block 90, the next step includes subjecting the base portion 32 of the housing 30 (with the attached microdevice die 26) and the lid 34 of the housing 30 (with the fine grain getter layer 40) to a vacuum environment. Thereafter, as mentioned in block 92, the process then includes activating the fine grain getter layer 40. In one embodiment, the fine grain getter layer 40 is activated through a thermal and vacuum process to remove hydrogen and other species from the getter material surface. This fresh surface acts as reactive units for gas and vapor adsorption.

In block 94, the process may further include attaching or otherwise bonding the lid 34 to the base portion 32. The attaching or bonding step is preferably done in a vacuum environment. In one embodiment, the lid 34 is attached to the base portion 32 to form a hermetic seal. A metal bonding process that uses either gold or a soldering material or welding may achieve the hermetic seal.

What has been described is a new microdevice having a fine grain getter layer for maintaining a vacuum within a hermetically sealed cavity surrounding the device's sensor microstructure. The use of a fine grain getter layer permits the getter to fit into extremely small cavities required in MEMS applications. The getter used in this invention also advantageously reduces failures that can result from falling getter particles on the sensor element. Further, the present invention significantly reduces the cost of making a vacuum-sealed microdevice by using low cost materials and reduced processing steps. This is especially important to high volume applications.

The above description of the present invention is intended to be exemplary only and is not intended to limit the scope of any patent issuing from this application. The present invention is intended to be limited only by the scope and spirit of the following claims.

What is claimed is:

1. A microdevice assembly comprising:
   a device microstructure, wherein the microstructure is an angular rate sensing element;
   a housing having a base portion and a lid, the device microstructure attached to the base portion, the lid hermetically sealed to the base portion, the housing defining a cavity surrounding the device microstructure; and
   a fine grain getter layer deposited on an interior side of the lid for maintaining a vacuum in the cavity surrounding the device microstructure.

2. The microdevice assembly of claim 1 wherein the device microstructure includes a pair of movable proof masses that oscillates within the cavity.

3. The microdevice assembly of claim 1 wherein the fine grain getter layer has a sub-micron grain size.

4. The microdevice assembly of claim 1 wherein the fine grain getter layer is in a spaced apart relationship from the device microstructure.

5. The microdevice assembly of claim 4 wherein the fine grain getter layer is activated by a thermal process to adsorb vapor and gas species.

6. The microdevice assembly of claim 1, wherein the device microstructure includes a substrate, the substrate attached to the base portion of the housing.

7. The microdevice assembly of claim 1 wherein the lid of the housing is made of KOVAR material and electroplated with a metallic material.

8. A microdevice assembly comprising:
   a hermetically sealed housing having an internal surface and an internal cavity;
   a microdevice die having a substrate and a microstructure formed thereon, the microdevice die mounted within the internal cavity of the hermetically sealed housing, the microstructure includes a pair of movable proof masses that oscillates within the cavity; and
   at least one fine grain getter layer deposited on the internal surface and within the internal cavity of the housing for maintaining a vacuum surrounding the microdevice die.

9. The microdevice assembly of claim 8 wherein the hermetically sealed housing is made of KOVAR material and electroplated with a metallic material.

10. The microdevice assembly of claim 9 wherein the hermetically sealed housing includes a base portion and a lid, the microdevice die attached to the vase portion of the housing and the at least one fine grain getter layer attached to the lid of the housing.

11. The microdevice assembly of claim 8 wherein the fine grain getter layer has a sub-micron grain size.

12. The microdevice assembly of claim 8 wherein the fine grain getter layer is in a spaced apart relationship from the microstructure.

13. The microdevice assembly of claim 12 wherein the fine grain getter layer is activated by a thermal process to adsorb vapor and gas species.

14. The microdevice assembly of claim 8 wherein the microstructure is an angular rate sensing element.

* * * * *